United States Patent [19]

Appelt et al.

[11] Patent Number: 5,305,186
[45] Date of Patent: Apr. 19, 1994

[54] POWER CARRIER WITH SELECTIVE THERMAL PERFORMANCE

[75] Inventors: Bernd K. Appelt, Apalachin; Irv Memis, Vestal; Richard A. Schumacher, Endicott; John M. Lauffer, Waverly, all of N.Y.

[73] Assignee: International Business Machines Corporation, Armonk, N.Y.

[21] Appl. No.: 9,958

[22] Filed: Jan. 27, 1993

[51] Int. Cl.⁵ .............................................. H05K 7/20
[52] U.S. Cl. ................................ 361/704; 257/713; 361/713; 361/764
[58] Field of Search ............... 165/80.3, 185; 174/16.3, 252; 257/705, 711, 713, 720; 361/386, 388, 389, 401, 704, 707, 713, 717, 718, 719, 764

[56] References Cited

U.S. PATENT DOCUMENTS

| | | | |
|---|---|---|---|
| 3,710,193 | 1/1973 | Greenberg | 174/16.1 |
| 3,952,231 | 4/1976 | Davidson | 361/386 |
| 4,383,270 | 5/1983 | Schelhorn | 357/81 |
| 4,420,364 | 12/1983 | Nukii et al. | 156/631 |
| 4,459,607 | 7/1984 | Reid | 357/71 |
| 4,544,989 | 10/1985 | Nakabu et al. | 361/401 |
| 4,551,746 | 11/1985 | Gilbert et al. | 357/74 |
| 4,585,706 | 4/1986 | Takeda et al. | 428/620 |
| 4,602,314 | 7/1986 | Broadbent | 361/386 |
| 4,667,219 | 5/1987 | Lee et al. | 357/68 |
| 4,700,273 | 10/1987 | Kaufman | 361/388 |
| 4,703,339 | 10/1987 | Matsuo | 357/81 |
| 4,705,606 | 10/1987 | Young et al. | 204/15 |
| 4,750,089 | 6/1988 | Derryberry et al. | 361/388 |
| 4,782,893 | 11/1988 | Thomas | 165/185 |
| 4,811,082 | 3/1989 | Jacobs et al. | 357/80 |
| 4,835,344 | 5/1989 | Iyogi et al. | 174/68.5 |
| 4,860,165 | 8/1989 | Cassinelli | 361/388 |
| 4,866,501 | 9/1989 | Shanefielt | 357/50 |
| 4,874,721 | 10/1989 | Kimura et al. | 437/209 |
| 4,879,630 | 11/1989 | Boucard et al. | 361/386 |
| 5,050,040 | 9/1991 | Gondusky | 361/388 |
| 5,133,403 | 7/1992 | Yokono | 165/185 |
| 5,200,641 | 4/1993 | Kosaki | 257/720 |

FOREIGN PATENT DOCUMENTS

0219627A1 4/1987 European Pat. Off. .
0381383A3 8/1990 European Pat. Off. .

OTHER PUBLICATIONS

Kraus, et al., Thermal Analysis and Control of Electronic Equipment, Hemisphere Publishing Corporation (1983) pp. 570–599.
Antonetti, et al., Heat Transfer in Electronic Pkgs., pp. 167–223.
Gaskill, Jr., et al. Kovar Large Area Hybrid Module, 31st Electronic Components Conference (1981) pp. 456–464.
Sechi, et al., Broadband Power Amplifiers Based on a New Monolithic Ceramic Technology, 1989 HEEE MTTT-S Digest, pp. 937–940.
Manufacture of Chip Carrier for Electronic Element, vol. 11, No. 325 (E-551) (1987).

Primary Examiner—Gerald P. Tolin
Attorney, Agent, or Firm—Pollock, Vande Sande & Priddy

[57] ABSTRACT

A microelectronic package comprising a circuit carrier having a power chip, an integrated circuit means, and thermal conduction means for carrying heat from the microelectronic package is provided. The thermal conduction means includes a first heat dissipation back plate means associated with the power chip and a second heat dissipation back plate means associated with the integrated circuit means. The heat dissipation back plate means are electrically isolated from each other and have different heat dissipation capacity.

16 Claims, 2 Drawing Sheets

POWER CARRIER WITH SELECTIVE THERMAL PERFORMANCE

TECHNICAL FIELD

The present invention is concerned with a microelectronic package, for example, a card or board, having thermal management structure. In particular, the present invention is concerned with microelectronic packages that include, on a single circuit carrier, at least one power chip and at least one active integrated circuit means and thermal conduction means for carrying heat from the microelectronic package. The thermal conduction means of the present invention provides for selective thermal conductivity pathways and therefore selective temperature distributions for the power chip and for the active integrated circuit means.

BACKGROUND ART

The structures and manufacturing processes for electronic packages are described in, for example, Donald T. Seraphin, Ronald Lasky, and Che-Yo Li, *Principles of Electronic Packaging*, McGraw-Hill Book Co., New York, N.Y. (1988) and Rao R. Tummala and Eugene J. Rymaszewski, *Microelectronic Packaging Handbook*, Van Nostrand Rinehold, New York, N.Y. (1988), disclosures of which are incorporated herein by reference.

An electronic circuit may contain many electronic circuit components, e.g. thousands or even millions of individual resistors, capacitors, inductors, diodes and transistors. These individual circuit components must be interconnected to form the circuits, and the individual circuits must be interconnected to form functional units. Power and signal distribution are done through these interconnections. The individual functional units require mechanical support and structural protection. The electrical circuits require electrical energy to function, and the removal of thermal energy to remain functional. Microelectronic packages, for example, chips, modules, circuit cards and circuit boards, are used to protect, house, cool and interconnect circuit components and circuits.

Within an integrated circuit, circuit component to circuit component and circuit to circuit interconnection, heat dissipation, and mechanical protection are provided by an integrated circuit chip. This chip enclosed within its module is referred to as the first level of packaging.

There is at least one further level of packaging. This second level of packaging is the circuit card. The circuit card is necessary for at least four functions. First, the circuit card is employed because the total required circuit or bit count to perform a desired function exceeds the bit count of the first level package, i.e. the chip. Second, the second level package, i.e. the circuit card, provides a site for components that are not readily integrated into the first level package, i.e. the chip or module. These components include capacitors, precision resistors, inductors, electromechanical switches, optical couplers, and the like. Third, the circuit card provides for signal interconnection with other circuit elements. Fourth, the second level package provides for thermal management, i.e. heat dissipation.

In most applications, there is a third level of packaging. This is the board level package. The board contains connector to accept a plurality of cards, and provide communication between the cards.

Increasing logic densities accompanied by increasing circuit densities impose higher thermal loads on electronic packages. In addition, power design, that is, card and board design, have been driven by the necessity of accommodating the ever-increasing density of logic or memory, with their concomitant increase in interconnections, in a smaller area. These higher density cards and boards have high power density, and therefore require sophisticated thermal management. In fact, the power demands have resulted in various power conversion cards, i.e. power supplies, of such design that the operating temperatures of the power conversion cards are usually at about 90°-110° C.

However, such relatively high card temperatures exceed the typically acceptable operating temperatures of about 75° C. and less for memory and logic chips as well as for capacitors and certain resistors. Accordingly, power supply functions and active functions such as logic and/or memory functions are typically placed onto separate cards in order to provide a reliable system.

A typical power supply card of interest is constructed of a top signal/component mounting layer and a bottom ground/heatsink layer separated by a thin, thermally enhanced dielectric material. The overall size of the carrier may range from at least about 1" in length or width, and generally about 2" by 4" dimensions. The top signal layer may be of any conducting material, generally about 0.001" to about 0.005" thick copper, and preferably about 0.003" to about 0.004". The defined signal layer contains pads for mounting of discrete devices including resistors, capacitors, inductors, transformers, integrated circuits and the like. The signal layer also includes circuit tracks for electrical interconnection of the various devices. The signal layer also functions to quickly spread heat from high power dissipation devices such as back side solder bonded, wire bonded power integrated circuits, i.e. heat spreader. The dielectric material is designed to efficiently transfer heat from the signal layer to the heatsink layer, while still providing electrical insulation between the two layers. The ground/heatsink layer is generally a thick metal plate, and preferably about 0.020" to about 0.1080" thick copper.

The thermal dissipation path from a back bonded chip on this type of carrier includes solder layer of about 0.002" to about 0.005" thick which transfers heat from the chip back side into the carrier signal layer. Heat is then spread in the horizontal direction through the signal layer heat spreader, followed by transfer through the dielectric layer into the back side heatsink layer where further horizontal spreading and transfer to ambient occurs. The thermal dissipation path can be further enhanced by one of several methods including copper plated or solder filled through holes or blink vias from the signal layer heat spreader to back side heat sink, or direct attach of the power chip to the heat sink through a window in the dielectric where the back side surface has been coined up through the top surface of the carrier, and the dielectric and top signal layers milled off. Enhancement of heat transfer from the heatsink to ambient can be achieved by etched grooves in the heatsink that increase surface area for radiative transfer and channel air flow for convective cooling.

More particularly, power supply carriers have several unique features that distinguish them from common circuit boards. For instant, power supplies contain several components (diodes and power chips) that require the dissipation of significant amounts of energy in order to maintain an acceptable chip junction temperature. Energy dissipation is currently managed by conducting the heat from the soldered component through a dielectric (with enhanced thermal conductivity) to a heat dissipating back plane. Such a configuration is so efficient in heat dissipation that the entire carrier is maintained at a uniformly high temperature. However, as mentioned above, the integration of the power functions with the active functions such as logic and/or memory functions is not practical or possible because the active functions such as the logic and/or memory functions cannot operate reliably at temperatures greater than about 75° C.

SUMMARY OF INVENTION

It is an object of the present invention to make possible the integration of power functions with active integrated circuit means such as logic and/or memory functions into a single printed circuit card. In particular, the present invention provides for selective thermal conductivity pathways and therefore selective temperature distributions for power and for active integrated circuit means such as the logic and/or power functions. In particular, the present invention makes it possible to control the temperature of for example the logic and/or memory functions to temperatures of 75° C. and below where reliable operation can be assured while the power functions can be operated at the desired temperatures of about 90°-110° C.

In particular, the present invention is concerned with a microelectronic package that comprises a single circuit carrier, power chip for powering an integrated circuit carried by the circuit carrier, active integrated circuit means carried by the circuit carrier, and thermal conduction means for carrying heat from the microelectronic package. The thermal conduction means comprises a first heat dissipation back plate means associated with the power chip and a second heat dissipation back plate means associated with the active integrated circuit means. The first and second heat dissipation back plate means are electrically isolated from each other. In addition, the heat dissipation capacity of the first heat dissipation back plate means differs from that of the second heat dissipation back plate means so that the temperature of operation associated with the active integrated circuit means is lower than that associated with the power chip.

BEST AND VARIOUS MODES FOR CARRYING OUT INVENTION

Figure 1:
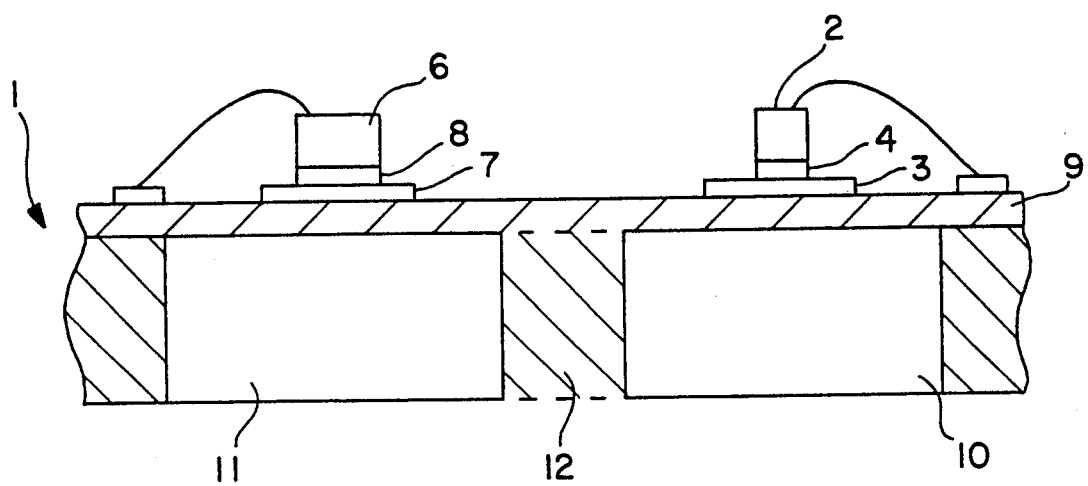
FIG. 1 is a schematic diagram of a printed circuit card fabricated pursuant to the present invention.

In order to facilitate an understanding of the present invention, reference is made to the figure.

The figure illustrates a circuit card 1 that includes a power chip 2 connected electrically to conductive member 3 for providing voltage from an outside source. This member 3 is typically copper. The chip is typically connected to member 3 employing solder 4. Also provided on integrated circuit card 1 is an active integrated circuit means such as a logic and/or memory chip 6 connected to electrical conductive means 7 through solder 8. The electrically conductive means 7 is preferably copper.

In order to conduct heat from the power chip and active integrated circuit means, a dielectric 9 is provided that connects to the heat dissipation thermal conduction means. The dielectric is typically a FR-4 type dielectric which can be thermally enhanced. Typically FR-4 epoxy compositions that can be employed contain about 70 to about 90 parts of brominated polyglycidyl ether of bisphenol-A and 10–30 parts of tetrakis (hydroxyphenyl) ethane tetraglycidyl ether cured with 3–4 parts of dicyandiamide and 0.2–0.4 parts of a tertiary amine, all parts being parts by weight per hundred parts of resin solids.

Another typical FR-4 epoxy contains about 25 to about 30 parts by weight of a tetrabrominated diglycidyl ether of bisphenol-A having an epoxy equivalent weight of about 350–450; about 10% to about 15% by weight of a tetrabrominated glycidyl ether of bisphenol-A having an epoxy equivalent weight of approximately 600–750; and about 55 to about 65 parts per weight of at least one epoxidized non-linear novolak having at least 6 terminal epoxy groups; along with suitable curing and/or hardening agents.

A still further FR-4 epoxy composition contains 70 to 90 parts of brominated polyglycidyl ether of bisphenol-A and 10 to 30 parts of tetrakis (hydroxy phenyl) ethane tetraglycidyl ether cured with 0.8-1.0 phr of 2-methylimidazole. Still other FR-4 epoxy compositions employ tetrabromobisphenol-A as the curing agent with 2-methylimidazole as the catalyst.

Preferably, the dielectric 9 is thermally enhanced and reinforced such as with glass or polymer fiber reinforcement along with a high thermal conductivity additive impregnated therein and dispersed therethrough. Exemplary high thermal conductivity additives include, by way of illustration, and not limitation, zinc oxide, aluminum oxide and aluminum nitride.

A heat dissipation back plate means 10 is associated with the power chip and a heat dissipation back plate means 11 is independently associated with the logic and/or memory means. The heat dissipation back plate means 10 and 11 are electrically insulated from each other by dielectric 12 but are not necessarily thermally isolated from each other. Dielectric 12 is typically any of the FR4 resin systems described hereinabove, with or without thermal enhancement means, and typically without reinforcing means. In particular, when the dielectric is thermally enhanced, the heat dissipation back plate means are thermally connected. By electrically isolating these heat dissipation back plate means from each other, it makes it possible to provide different voltages in different regions of the card as well as bussing different voltages through isolated segments to different regions on the card. The back plate means provide both a heat sink as well as being a voltage plane. The heat capacity of the heat dissipation back plate means differ from each other such that the temperature during operation of the power chip is higher than the temperature during operation of the active integrated circuit means. This temperature differential can be controlled by the particular type of dielectric provided between the back plate means such as whether thermally enhanced or not, the width of the gap between the heat dissipation back plate means, as well as the size of the heat dissipation back plate means.

The design of the back place isolation is optimized for desired power and memory/logic chip junction temperatures through modelling with input parameters including chip power dissipation, total card size, isolation slot width and dielectric material, and ambient conditions such as temperature and airflow conditions. By way of example, a power/logic card size of 10.0 square inches with a 0.125" wide isolation slot in a 45° C., natural convection environment would provide power and logic chip junction temperatures of 110° C. and 75° C. respetively with power dissipations of 7 and 1 Watts, respectively. A card of the same dimensions and conditions without isolation would provide chip junction temperatures of 105° C. for both the power and logic chips. It is obvious from the above that the number of input and design variables is large, but the design task is simplified by understanding of the thermal resistance paths involved, and incorporating each path into a model using well known circuit analysis techniques (i.e., resistors in series and parallel).

The electrical isolation between the heat dissipation back plate means can be provided in various ways. For instance, a first isolation slot can be provided in the heat dissipation back plate means such as 40 mil copper by routing or punching followed by filling the isolation slot by laminating with a prepreg of an FR-4 epoxy. This is followed by peeling the mask and prepreg from everywhere except from the slot and then repeating the procedure for the second and subsequent isolation slots. In addition, instead of individually providing the isolation slots, the entire sequence of isolation slots can be done simultaneously followed by lamination and filling of the slots with the dielectric.

Figure 2A:
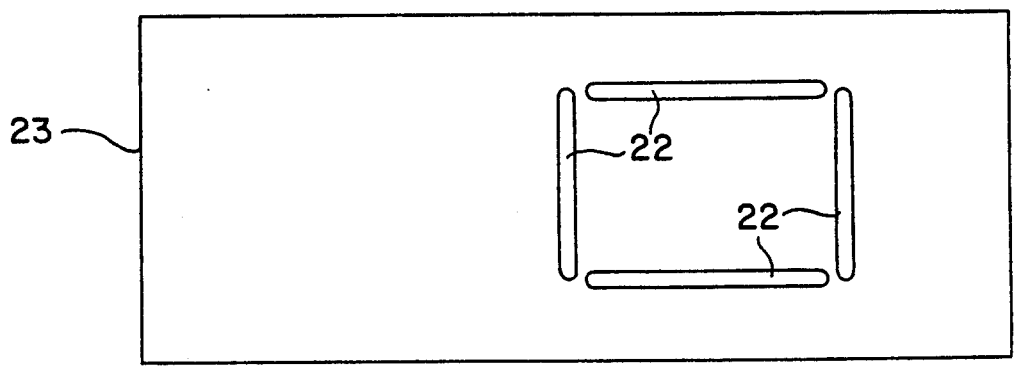
FIG. 2A, 2B and 2C are schematic diagrams of a preferred embodiment for carrying out the present invention.
Figure 2B:
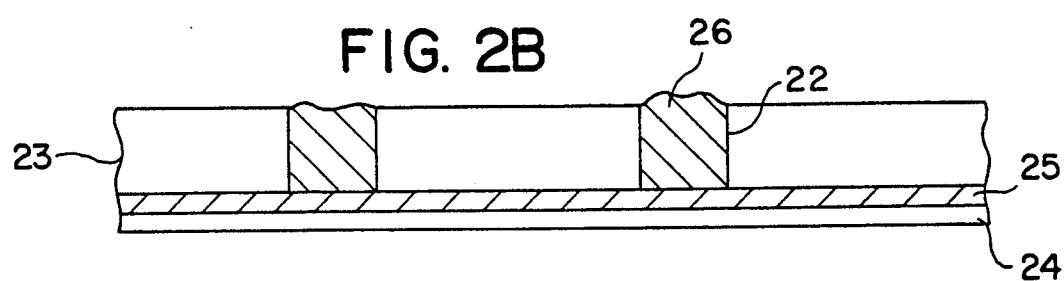
Figure 2C:
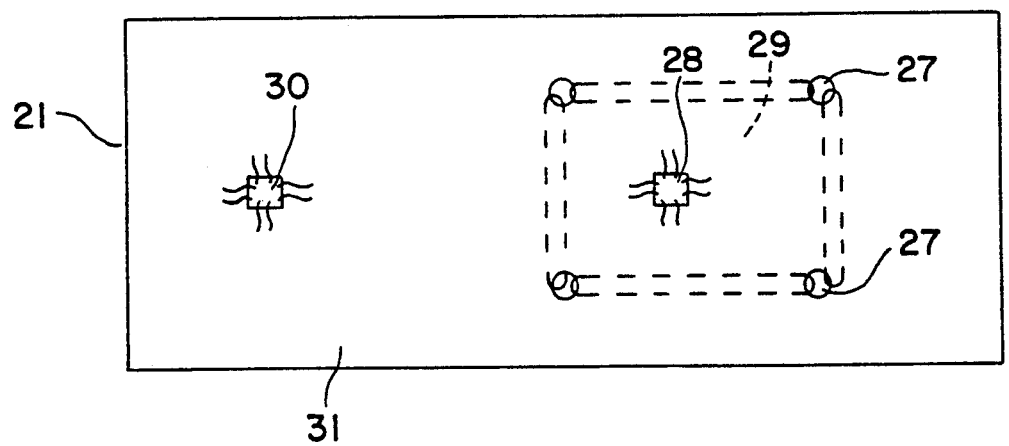

A preferred means for carrying out the present invention is described below, and in FIGS. 2A, 2B and 2C. FIG. 2A depicts a top view of the metal back plate. FIG. 2B is an exploded cross-section view. FIG. 2C depicts a top view of the finished carrier with full isolation. With reference to FIG. 2A, a set of first isolation slots (22) is formed in the metal back plate (23) by routing or punching. The slots create the general shape of a square, but with each corner of the square left intact. Referring to FIG. 2B, the thick copper (23) is then placed on top of the card signal layer copper (24) and intermediate thermally enhanced dielectric layer (25). A dielectric such as an epoxy resin (26) is then dispensed in the isolation slots (22) and contained on the bottom side by the thermally enhanced dielectric layer (25). Construction is then placed in a lamination press under sufficient temperature and pressure. The temperature and pressure to cause the three layers of the stack to be bonded together as well as to fully cure both the thermally enhanced dielectric layer (25) as well as the resin (26) of the isolation slots. Isolation may now be completed by drilling or punching out of the four remaining connection areas (27) as shown in FIG. 2C. These drilled or punched areas may be filled with additional resin, or they may be left open. Also depicted in FIG. 2C of the finished carrier (21) is a logic chip (28) contained within the isolated section (29) and a power chip (30) contained on the power section (31).

Although the figures depict singla card images, it should be understood that this method or other isolation methods may be performed on many card images simultaneously where multiple cards are contained on one panel.

What is claimed is:

1. A microelectronic package comprising a single circuit carrier, a power chip for powering an active integrated circuit carried by said single circuit carrier, an active integrated circuit carried by said single circuit carrier, and thermal conduction means for carrying heat away from said microelectronic package which thermal conductive means comprises a first heat dissipation back plate means connected to said power chip and a second heat dissipation back plate means connected to said active integrated circuit, and wherein said first heat dissipation back plate means and said second heat dissipation back plate means are electrically isolated from each other by electrical isolation located therebetween, and wherein the heat dissipation capacity of said first heat dissipation back plate means differs from the heat dissipation capacity of said second heat dissipation back plate means so that the temperature of the power chip during operation is higher than the temperature of said active integrated circuit during operation.

2. The microelectronic package of claim 1 wherein said active integrated circuit is a member selected from the group consisting of a logic means, memory means, and both logic means and memory means.

3. The microelectronic package of claim 1 wherein the temperature of operation of said power chip is about 90° to about 110° C. and the temperature of operation of said active integrated circuit is 75° C. or less.

4. The microelectronic package of claim 1 wherein said thermal conduction means is copper.

5. The microelectronic package of claim 1 wherein said power chip and said active integrated circuit are connected to individual copper circuit pads.

6. The microelectronic package of claim 5 wherein the connection is through solder.

7. The microelectronic package of claim 1 wherein the first and second heat dissipation means are electrically isolated from each other with a dielectric.

8. The microelectronic package of claim 7 wherein said dielectric contains a high thermally conductive additive to thereby achieve enhanced thermal conductivity.

9. The microelectronic package of claim 1 wherein isolation slots in the general shape of a square surround said active integrated circuit.

10. The microelectronic package of claim 9 wherein dielectric is contained in said isolation slots.

11. The microelectronic package of claim 10 which includes a signal layer and a thermally enhanced dielectric layer located between said signal layer and said first and second heat dissipation back plate means.

12. The microelectronic package of claim 11 wherein the active integrated circuit is a logic means or memory means or both.

13. The microelectronic package of claim 11 wherein the active integrated circuit is a logic means.

14. The microelectronic package of claim 11 wherein the temperature of operation of said power chip is about 90° to about 110°0 C. and the temperature of operation of said active integrated circuit is 75° C. or less.

15. The microelectronic package of claim 11 wherein said thermal conduction means is copper.

16. The microelectronic package of claim 1 wherein said electrical isolation comprises isolation slots.

* * * * *